United States Patent [19]

Kaneko et al.

[11] Patent Number: 4,464,781
[45] Date of Patent: Aug. 7, 1984

[54] EQUALIZER APPARATUS

[75] Inventors: Akio Kaneko; Hitoshi Kajiwara, both of Iwaki, Japan

[73] Assignee: Alps Electric Co., Ltd., Tokyo, Japan

[21] Appl. No.: 281,712

[22] Filed: Jul. 9, 1981

[30] Foreign Application Priority Data

Jul. 9, 1980 [JP] Japan .................................. 55-92739

[51] Int. Cl.$^3$ .............................................. H03H 5/00
[52] U.S. Cl. .................................. 381/12; 333/28 R; 381/18; 381/98
[58] Field of Search .................... 179/1 B, 1 D, 1 SW, 179/1 G, 1 GQ; 333/28 R, 28 T; 381/11, 12, 98, 18-21

[56] References Cited

U.S. PATENT DOCUMENTS

| 3,397,286 | 8/1968 | Prewitt et al. | 381/24 |
| 4,064,364 | 12/1977 | Veale . | |
| 4,107,622 | 8/1978 | Toyomaki . | |
| 4,225,834 | 9/1980 | van Doorn . | |
| 4,276,508 | 6/1981 | Usugi | 179/1 D |
| 4,292,467 | 9/1981 | Odlen et al. | 179/1 D |

OTHER PUBLICATIONS

Stereo Catalog 1981, Ziff-Davis Pub. Co.; 1980; p. 220, "JVC SEA-80 Graphic Equalizer"; p. 227, Technics SH8020, Equalizer.
Stereo Catalog 1976, Ziff-Davis Pub. Co.; 1975; p. 103, "Hitachi SMR 7240 4/2 Channel Receiver".

Primary Examiner—R. J. Hickey
Attorney, Agent, or Firm—Guy W. Shoup; Gerard F. Dunne

[57] ABSTRACT

An equalizer apparatus for audio equipment capable of selecting between a 2-speaker system and a 4-speaker system, including a display device indicating proper operation of the control knobs of the equalizer. The display device includes a first illuminable element of a first color for indicating operation of one channel of stereophonic sound reproduction, a second illuminable element of a second color for indicating operation of the other channel of stereophonically reproduced sound, and color coded means corresponding to said first and second colors for indicating which of the control knobs produce data signals for the first channel and which of the control knobs produce data signals for the second channel. Further, the color coded means may indicate which of the control knobs produce data signals for each of the divided frequencies of the respective channels during operation of the audio equipment in the manner simulating quadriphonic sound.

10 Claims, 4 Drawing Figures

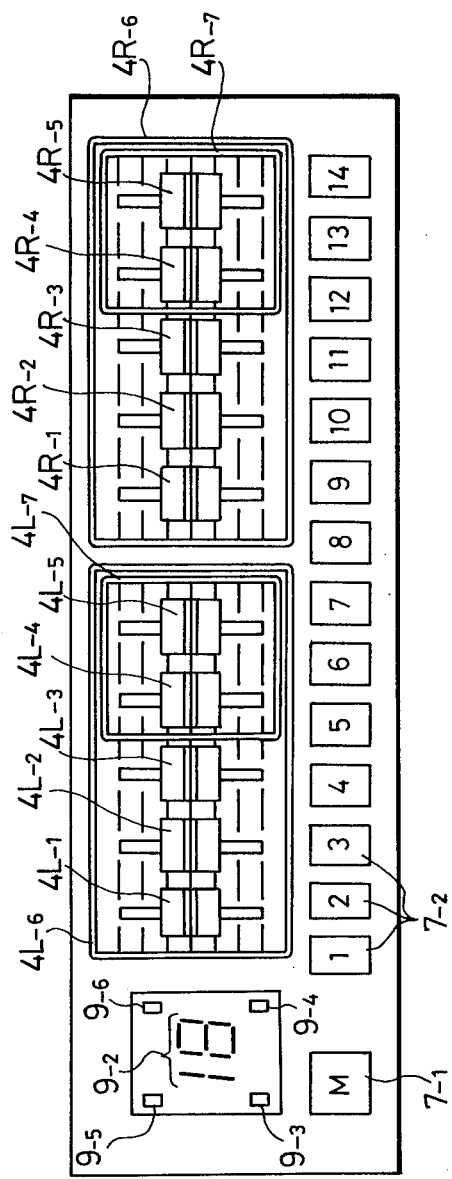

EQUALIZER APPARATUS

BACKGROUND OF THE INVENTION

The present invention relates to a graphic equalizer for audio equipment usable in automobiles, such as a car stereo.

Audio equipment usable in automobiles typically includes an AM/FM radio, a tape recorder or the like which are often combined in a single unit commonly referred to as a car stereo.

Such audio equipment has become quite popular and increasingly the same high fidelity normally expected from high-quality home audio equipment is now often required in car stereos. It has thus become necessary to increase the sound fidelity in automobile audio equipment and, consequently, equalizers to compensate for sound distortions caused by the acoustical characteristics of the car interior and frequency deviations have come into increasing use.

The graphic equalizer (hereinbelow, abbreviated to "GEQ") is a popular equalizer apparatus which divides the frequency band of audio signals into a large number of frequency subbands or channels and which can vary the frequency characteristics at the respective channels, and thereby change the frequency characteristics over the entire band as desired. In general, the GEQ includes a combination of a simulated inductor and a bridging amplifier which are constructed of operational amplifiers. By disposing such a GEQ in a car stereo, the aforecited fidelity requirements can be met.

The GEQ, however, has quite a large number of variable resistors or switches for adjusting the frequency characteristics of a number of channels as stated above, and considerable skill is often required to operate the GEQ properly. Moreover, even when one has become skilled in operation of the GEQ, the operation is still troublesome and complicated.

Accordingly, the user of the typical GEQ has the considerable burden of repeating the troublesome operation of the GEQ whenever the sound program or mode of operation is changed. This problem is especially acute in automotive audio equipment since the operation of a complicated GEQ may often divert the driver's attention from safe operation of the automobile.

In order to solve such problems, there has been proposed a GEQ wherein data corresponding to various frequency characteristics intended to be attained with the GEQ are set in a memory or the like in advance and, when necessary, the desired frequency characteristics can be attained merely by selecting the appropriate preset data.

Such a GEQ is often referred to as a presetable GEQ and often is used with a car stereo which may simulate a quadraphonic or 4-channel stereo system by dividing each channel of a stereophonic source program by frequency or the like and directing the divided sound signals to separate speakers disposed within four locations within the automobile. In some sound programs, it has become desirable to give rise to a special mood by altering the frequency characteristics by the GEQ and it is also necessary to be able to switch between normal stereophonic sound reproduction and the simulated 4-channel sound depending upon the sound programs or personal tastes.

The typical GEQ has quite a large number of control knobs for the respective frequency subbands and when changing from a standard stereophonic system to a simulated 4-channel system, the various knobs of the GEQ often correspond to different frequency subbands and this, of course, leads to difficulties of operation. By way of example, when the signals of a stereophonic program source having a left and right channels are divided into high frequency signals and low frequency signals for the respective channels to provide a simulated 4-channel system, each of the GEQs for the left and right channels must be divided according to the frequency of the two different speakers for that channel, while the GEQ for each channel operates normally in the stereophonic system. Therefore, the operator must determine which of the control knobs of the two GEQs are for each of the four speakers when listening to the sound program in a simulated 4-channel mode.

In order to let the operator recognize which knobs correspond to which uses more easily, the control panel of the car stereo often indicates the various uses for the control knobs with letters, symbols or the like. In general, however, the car stereo is installed in the dashboard or the like of the automobile, and thus the area of the control panel must be made as small as possible. Therefore, there is minimal space for the control panel of the GEQ and the various symbols used to identify the control knobs are often eliminated or, if present, are often not easily readable, and satisfactory operation is thus difficult to attain.

SUMMARY OF THE INVENTION

An object of the present invention is to eliminate the disadvantages described above, and to provide an equalizer apparatus which has frequency characteristics preset and can be operated easily in reproducing sound programs either stereophonically or in a simulated quadriphonic manner.

In order to accomplish the object, the present invention includes a GEQ wherein the operation of either the 2-speaker system or the 4-speaker system can be displayed on the control panel of presetable GEQs of 2 channels so as to definitely indicate the operating sections of the corresponding GEQs.

BRIEF DESCRIPTION OF THE DRAWINGS

FIG. 4 is a front elevation illustrating an embodiment of the control panel of the equalizer according to the present invention.

PREFERRED EMBODIMENTS OF THE INVENTION

Hereunder, embodiments of an equalizer apparatus according to the present invention will be described with reference to the accompanying drawings.

Figure 1:
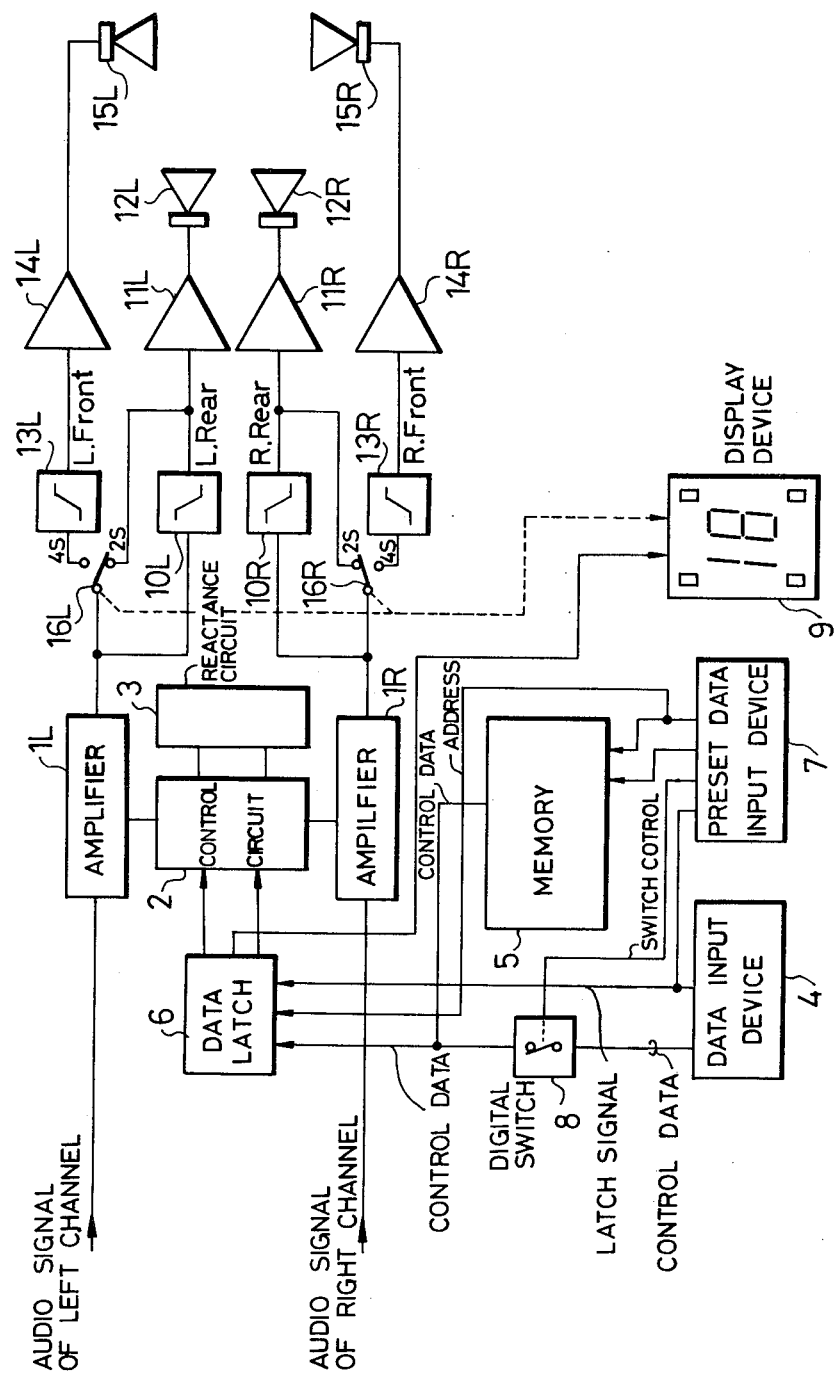
FIG. 1 is a system block diagram which shows an embodiment of an equalizer apparatus according to the present invention.

FIG. 1 is a system block diagram showing an embodiment of the present invention. The equalizer apparatus of the illustrative embodiment comprises an amplifier 1L for one channel of stereophonic sound and an amplifier 1R for the other channel. A control circuit 2 receives signals from a reactance circuit 3, and a data input device 4, a memory 5, a data latch 6, a preset data input device 7, and a digital switch 8 are also provided for producing input signals for the control circuit 2. A display device indicates the mode of operation of the equalizer, as will be set forth more fully below, and low-pass filters (LPFs) 10L and 10R, power amplifiers 11L and 11R, rear speakers 12L and 12R, high-pass filters (HPFs) 13L and 13R, power amplifiers 14L and 14R, front speakers 15L and 15R, and switches 16L and 16R for selection between the 2-speaker system and the 4-speaker system are also provided.

Audio signals from the tape deck of a car stereo, a radio or the like are supplied to respective inputs of the equalizer for the left channel and the right channel, and are endowed with any desired frequency characteristics by passing through the amplifiers 1L and 1R receiving modulating signals from the control circuit 2. The signals thus processed are delivered from the outputs of the amplifiers 1L and 1R to the respective selection switches 16L and 16R.

With the selection switches 16L and 16R positioned to connect the contacts 2S with the respective amplifiers 1L and 1R, the signals from these amplifiers are passed directly to respective power amplifiers 11L and 11R, where they are sufficiently amplified to drive respective speakers 12L and 12R. In this manner, the conventional stereophonic sound reproduction in two channels can be carried out.

On the other hand, when the selection switches 16L and 16R are positioned to connect the contacts 4S with the respective amplifiers 1L and 1R, the signals from the respective amplifiers 1L and 1R are applied to the power amplifiers 11L and 11R through the LPFs 10L and 10R and are also applied to power amplifiers 14L and 14R via the HPFs 13L and 13R.

Accordingly, those low-frequency components within the audio signals passed through the LPFs 10L and 10R are reproduced in the rear speakers 12L and 12R, and those high-frequency components which have passed through the HPFs 13L and 13R and reproduced in the front speakers 15L and 15R. In this way, the sound reproduction affording a simulated quadriphonic 4-channel effect can be carried out.

The reactance circuit 3 is typical of circuits of conventional GEQs and consist of a large number of reactance elements. The reactance circuit 3 is connected through the control circuit 2 to the amplifiers 1L and 1R constituting the transmission circuits of the GEQs and the audio signals passing through the amplifiers 1L and 1R are controlled by being endowed with any desired frequency characteristic for each of a large number of subbands or channels extending over the entire frequency range of the signals input to the amplifiers. The control circuit 2 consists of a plurality of sets of resistance networks and electronic switches arranged in sets in a known manner. In operation, the electronic switches are selectively controlled by control data received from the data latch 6, and any desired reactance elements within the reactance circuit 3 are connected to the amplifiers 1L and 1R through the predetermined resistance networks so as to afford the desired frequency characteristics, as in conventional presetable GEQs. Herein, as stated before, bridging amplifiers constructed of operational amplifiers or the like are chiefly used as the amplifiers 1L and 1R, and simulated inductors similarly constructed of operational amplifiers are used for reactance elements of the reactance circuit 3.

Now, the operation of supplying data to the data latch 6 will be described.

The data input device 4 can provide data affording the characteristics of any desired frequency by the use of a plurality of variable resistors, multiple-contact switches, slide encoders or the like. Such devices are well known and typically are constructed of slide type variable resistors or slide type multiple-contact switches in the number of, for example, five for each channel. By operating the knobs of these components, the data affording the necessary frequency characteristics can be generated. The preset data input device 7 is a keyboard switch which consists of a memory key and several preset keys typically having respective numbers. When the memory key and one of the preset keys are simultaneously depressed, a write signal WE is generated, and the data set in the data input device 4 at that time is stored in the address of the memory 5 corresponding to the depressed preset key. When only the preset key is subsequently depressed, the data is read out from the particular address of the memory 5 and is given to the data latch 6.

Upon the depression of only the preset key, a switch control signal and a latch signal are also generated simultaneously with the readout of the date from memory 5.

Also when a knob of the data input device 4 is operated, the latch signal is generated.

Now, when the data input device 4 is operated by moving the knob of a variable resistor or switch thereof, the latch signal is applied to the data latch 6, and the data having been previously latched is erased and the new control data set in the date input device 4 is latched. This control data is given to the control device 2.

When a preset key of the preset data input device 7 is depressed, the control data recorded in the corresponding address is read out from the memory 5. At the same time, the switch control signal is applied to the digital switch 8 to turn it off and the latch signal is applied to the data latch 6. Therefore, any data previously latched in the data latch 6 is erased and the control data read out from the memory 5 is latched in the data latch 6, and it is given to the control circuit 2.

Accordingly, by operating the data input device 4, the required frequency characteristics can be attained in quite the same manner as in the conventional GEQ by actuation of the knobs of the variable resistors or switches which are disposed therein in the number of, for example, five for each channel. In addition, the operation of a presetable GEQ is achieved. That is, merely by the selective operation of the preset key of the preset data input device 7, one of the data previously set with the data input device 4 is selected and the frequency characteristics corresponding thereto are attained.

Figure 2:
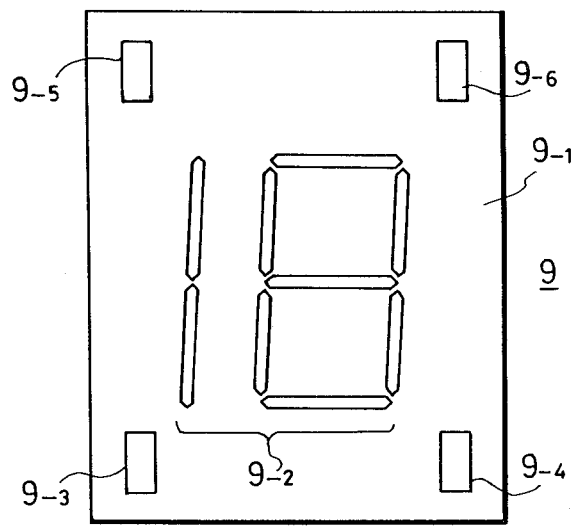
FIG. 2 is a front elevation of an embodiment of a display device.
Figure 3:
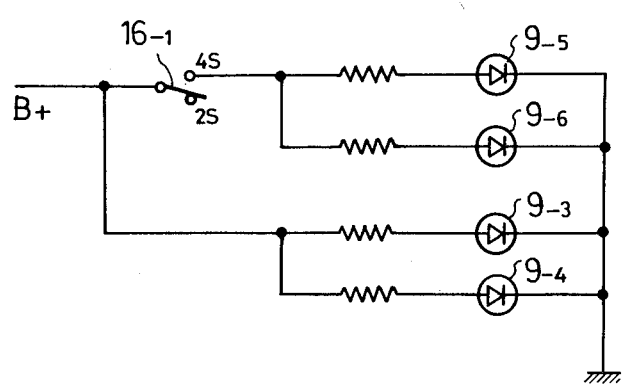
FIG. 3 is a circuit diagram illustrating an embodiment of a driver circuit for the display device.

When supplied with a signal from the data latch 6 and with a control data provided by operating the preset key of the preset data input device 7, the display device 9 displays the numeral corresponding to the particular preset key with a suitable numeral-displaying element and also displays the state of the switches 16L and 16R. An embodiment of an aspect of the display is shown in FIG. 2. In the FIGURE, 9-1 indicates the face panel of the display device 9, 9-2 indicates the element for displaying the numeral in 2 digits, 9-3 and 9-6 indicate red light emitting elements, and 9-4 and 9-5 indicate green light emitting elements. The numeral displaying element 9-2 may be any desired device such as a segment type LED, flourescent display tube or liquid-crystal device, while the light emitting elements 9-3 to 9-6 may be, for example, LEDs of the appropriate colors. An embodiment of a driver circuit for the light emitting elements 9-3 to 9-6 is shown in FIG. 3. In the FIGURE, 16-1 indicates a switch which is interlocked with selection switches 16L and 16R.

Accordingly, when the car stereo is operating as the 2-speaker system, the red emitting element 9-3 and the green light emitting element 9-4 are lit up, and when it is operating as the 4-speaker system, all the light emitting elements 9-3 to 9-6 are lit up.

FIG. 4 shows an embodiment of the control panel of the equalizer apparatus according to the present invention. 4L-1 to 4L-5 indicate the knobs of slide resistances for the left channel, and 4R-1 to 4R-5 the knobs of slide resistances for the right channel. 4L-6 indicates a display frame of red, 4L-7 a display frame of green, 4R-6 is also a display frame of green, and 4R-7 a display frame of red. 7-1 indicates the memory key, and 7-2 the preset keys.

Here, the knobs 4L-1 to 4L-5 and 4R-1 and 4R-5 are the knobs of the variable resistors or switches of the data input device 4 in FIG. 1, and the memory key 7-1 and the preset keys 7-2 are the keyboard switches disposed in the preset data input device 7.

Assuming now that the operation of the car stereo is of the 2-speaker system, only the red light emitting element 9-3 and the green light emitting element 9-4 are lit up.

At this time, accordingly, the operator can immediately recognize the fact that control knobs 4L-1 to 4L-5 enclosed immediately with the red display frame 4L-6 correspond to all the frequency characteristics of the left channel and that the control knobs 4R-1 to 4R-5 enclosed with the green display frame 4R-6 correspond to all the frequency characteristics of the right channel.

When the operation of the car stereo is of the 4-speaker system, the green light emitting element 9-5 and the red light emitting element 9-6 are lit up in addition to the red and green light emitting elements 9-3 and 9-4.

At this time, therefore, the red display frame 4L-6 is indicated by the lighting of the red light emitting element 9-3, and it is indicated by the lighting of the green light emitting element 9-5 that the knobs 4L-4 and 4L-5 lying within the frame enclosed with the green display frame 4L-7 inside the display frame 4L-6 correspond to signals which are reproduced from the front speakers. Likewise, the green display frame 4R-6 is indicated by the lighting of the green lights emitting element 9-4 and by the lighting of the red light emitting element 9-6 the red display frame 4R-7 inside the display frame 4R-6 indicates the adjusting knobs 4R-4 and 4R-5 which correspond to the front speakers of the right channel.

At this time, accordingly, the operator is properly informed of the fact that the characteristics of the rear speakers in the left and right channels ought to be adjusted by the adjusting knobs 4L-1 to 4L-3 and 4R-1 to 4R-3 respectively, while the characteristics of the front speakers by the adjusting knobs 4L-4 as well as 4L-5 and 4R-4 as well as 4R-5 respectively.

On the other hand, when any one of the preset keys 7-2 is depressed, the corresponding address data is given to the memory 5 and the control data for the particular address is written thereinto or read out therefrom as stated before. Simultaneously therewith, the address is applied to the data latch 6 as the display data, and the latched display data is displayed as a numeral by the numeral displaying element 9-2 of the display device 9.

Accordingly, when the control data from the data input device 4 has been written into the memory 5 with the preset key 7-2 of the preset data input device 7 and when the control data has been read out from the memory 5 and transmitted to the data latch 6 with the same, the numeral of the operated preset key 7-2 is kept displayed by the numeral displaying element 9-2 until the data input device 4 or the preset data input device 7 is thereafter operated again. That is, which of the preset keys has given the frequency characteristics afforded by the GEQ at the present is indicated. This permits the operator to correctly perform the operations of presetting the control data, etc.

In the above embodiment, the red indicative frames 4L-5 and 4R-7 are respectively disposed in correspondence with the red light emitting elements 9-3 and 9-6, and the green indicative frames 4R-6 and 4L-7 in correspondence with the green light emitting elements 9-4 and 9-5, whereby the operation of the GEQ is indicated by the correspondence with the colors. The present invention, however, is not restricted to the illustrated embodiment, and the colors, positions shapes etc. of the light emitting elements 9-3 to 9-6 and the indicative frames 4L-6, 4L-7, 4R-6 and 4R-7 can be determined as desired. By way of example, it is also allowed to make the colors of all the light emitting elements 9-3 to 9-6 different and to make the colors of all the indicative frames 4L-6 etc- different in correspondence therewith.

As set forth above, according to the present invention, the selection of the characteristics of GEQ in a car stereo or the like can be effected merely by operating a single preset key. Also, in a car stereo which can be used in a 2-speaker system or a 4-speaker system without disposing additional letters, sysmbols or the likes ona control panel, the operations of a GEQ can be correctly indicated. It is therefore possible to eliminate the disadvantages of the known GEQs and to provide an equalizer apparatus whose control panel has a small area and which can be operated safely and reliably.

What is claimed is:

1. An equalizer for audio equipment capable of producing two-channel sound stereophonically or simulated quadraphonically by dividing the audio signals for each channel into two frequency bands, including data means including respective control knobs for providing data signals corresponding to changes desired in the frequency characteristics of the sound reproduced by the audio equipment, control means receiving said data signals for altering the frequency characteristics of the reproduced sound according to the data signals received, and display means indicating whether the sound is being reproduced stereophonically or simulated quadraphonically and the operation of said data means, said display means including a first illuminable element of a first color for indicating operation of one channel of stereophonic sound reproduction, a second illuminable element of a second color for indicating operation of the other channel of stereophonically reproduced sound, and color coded means corresponding to said first and second colors for indicating which of said control knobs produce data signals for said first channel and which of said control knobs produce data signals for said second channel, said color coded means further serving to indicate by said first and second colors which of said control knobs produce data for each of the divided frequencies of the respective channels during operating of said audio equipment to stimulate quadraphonic sound.

2. An equalizer according to claim 1, said data means including a plurality of control knobs operated manually for setting desired data signals and each corresponding to a subband of the frequency range of the audio signal for one or the other channel.

3. An equalizer according to claim 2, said data means including a memory receiving data signals preset by operation of said control knobs for storing said data signals for later recall for said control means.

4. An equalizer according to claim 1, further including a memory receiving said data signals for later recall for said control means.

5. An equalizer for audio equipment capable of producing two-channel sound stereophonically or simulated quadraphonically by dividing the audio signal for each channel into two frequency bands, including data means including respective control knobs for providing data signals corresponding to changes desired in the frequency characteristics of the sound reproduced by the audio equipment, control means receiving said data signals for altering the frequency characteristics of the reproduced sound according to the data signals received, and display means indicating whether the sound is being reproduced stereophonically or simulated quadraphonically and the operation of said data means, said display means including a first illuminable element of a first color for indicating operation of one channel of stereophonic sound reproduction, a second illuminable element of a second color for indicating operation of the other channel of stereophonically reproduced sound, and color coded means corresponding to said first and second colors for indicating which of said control knobs produce data signals for said first channel and which of said control knobs produce data signals for said second channels, said color coded means further serving to indicate which of said control knobs produce data signals for each of the divided frequencies of the respective channels during operation of said audio equipment simulating quadraphonic sound by including a first border of said first color surrounding the control knobs adapted to produce data signals for said first channel, a second border of said second color surrounding the control knobs adapted to produce data signals for said second channel, a third border fitted within said first border and being of a color distinguishable from said first color, said third border surrounding those of said control knobs adapted to produce one of the divided frequencies of said first channel, and a fourth border fitted within said second border and being of a color distinguishable from said second color, said fourth border surrounding those knobs adapted to produce one of the divided frequencies of said second channel.

6. An equalizer according to claim 5, said audio equipment adapted to be used in an automobile.

7. An equalizer according to claim 1, said color coded means including a first border of said first color surrounding the control knobs adapted to produce data signals for said first channel and a second border of said second color surrounding the control knobs adapted to produce data signals for said second channel.

8. An equalizer according to claim 7, said audio equipment being adapted to be used in an automobile.

9. An equalizer according to claim 5, said audio equipment being adapted to be used in an automobile.

10. An equalizer according to claim 1, said audio equipment being adapted to be used in an automobile.

* * * * *